United States Patent [19]

Wang

[11] Patent Number: 5,784,289
[45] Date of Patent: *Jul. 21, 1998

[54] METHOD FOR ESTIMATING ROUTABILITY AND CONGESTION IN A CELL PLACEMENT FO INTEGRATED CIRCUIT CHIP

[75] Inventor: Deborah Chao Wang, San Jose, Calif.

[73] Assignee: LSI Logic Corporation, Milpitas, Calif.

[*] Notice: The term of this patent shall not extend beyond the expiration date of Pat. No. 5,587,923.

[21] Appl. No.: 774,281

[22] Filed: Dec. 20, 1996

Related U.S. Application Data

[63] Continuation of Ser. No. 301,687, Sep. 7, 1994, Pat. No. 5,587,923.

[51] Int. Cl.$^6$ ........................................... G06F 17/10
[52] U.S. Cl. ........................ 364/490; 364/488; 364/489; 364/491
[58] Field of Search ........................ 364/488, 489, 364/490, 491

[56] References Cited

U.S. PATENT DOCUMENTS

| | | | |
|---|---|---|---|
| 4,484,292 | 11/1984 | Hong et al. | 364/491 |
| 4,593,363 | 6/1986 | Burstein et al. | 364/491 |
| 4,613,941 | 9/1986 | Smith et al. | 364/490 |
| 4,615,011 | 9/1986 | Linsker | 364/491 |
| 4,686,629 | 8/1987 | Noto et al. | 364/491 |
| 4,752,887 | 6/1988 | Kuwahara | 364/491 |
| 4,777,606 | 10/1988 | Fournier | 364/491 |
| 4,849,904 | 7/1989 | Aipperspach et al. | 364/489 |
| 4,858,143 | 8/1989 | Fournier | 364/491 |
| 4,890,238 | 12/1989 | Klein et al. | 364/491 |
| 4,908,772 | 3/1990 | Chi | 364/491 |
| 4,918,614 | 4/1990 | Modarres et al. | 364/490 |
| 4,931,946 | 6/1990 | Ravindra et al. | 364/490 |
| 4,975,854 | 12/1990 | Yabe | 364/491 |
| 5,072,402 | 12/1991 | Ashtaputre et al. | 364/491 |
| 5,113,352 | 5/1992 | Finnerty | 364/490 |
| 5,140,402 | 8/1992 | Murakata | 364/491 |
| 5,224,056 | 6/1993 | Chene et al. | 364/490 |
| 5,224,057 | 6/1993 | Igarashi et al. | 364/490 |
| 5,237,514 | 8/1993 | Curtin | 364/490 |
| 5,251,147 | 10/1993 | Finnerty | 364/490 |
| 5,308,798 | 5/1994 | Brasen et al. | 364/491 |
| 5,339,252 | 8/1994 | Carrig et al. | 364/489 |
| 5,397,749 | 3/1995 | Igarashi | 364/488 |
| 5,587,923 | 12/1996 | Wang | 364/490 |

OTHER PUBLICATIONS

"Algorithms for VLSI Physical Design Automation," Naveed A. Sherwani, Kluwer Academic Publishers, 1993, pp. 73–85.

Primary Examiner—Kevin J. Teska
Assistant Examiner—Tyrone V. Walker
Attorney, Agent, or Firm—Mitchell, Silberberg & Knupp LLP

[57] ABSTRACT

A cell placement for a microelectronic integrated circuit includes a plurality of cells interconnected by nets of wiring. A method for estimating routing density in the placement includes superimposing a pattern of contiguous tiles over the placement, with each of the tiles having edges. Bounding boxes are constructed around the nets, and net probable densities are calculated within each bounding box for the wiring required by each net for each edge respectively. The net probable densities are summed to produce total probable densities of wiring required by all of the nets for each edge respectively. The net probable density for each edge is calculated as being equal to a wiring capacity of the edge divided by the sum of the wiring capacity of the edge and all other unobscured edges within the bounding box that are collinear with the edge respectively. A congestion map can be constructed from the total probable densities and the capacities of the edges, and/or these calculations can be used to predict the routability or unroutability of the placement. Provisions are made for edges that are obscured by large megacells or other obstacles, including providing routing detours around the obstacles.

24 Claims, 8 Drawing Sheets

METHOD FOR ESTIMATING ROUTABILITY AND CONGESTION IN A CELL PLACEMENT FO INTEGRATED CIRCUIT CHIP

This application is a continuation U.S. patent application Ser. No. 08/301,687, dated Sep. 7, 1994, now U.S. Pat. No. 5,587,923.

BACKGROUND OF THE INVENTION

1. Field of the Invention

The present invention generally relates to the art of microelectronic integrated circuits, and more specifically to a method for estimating routability and congestion in a cell placement for a microelectronic integrated circuit.

2. Description of the Related Art

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

Prior art methods for achieving this goal comprise generating one or more initial placements, modifying the placements using optimization methodologies including genetic algorithm operators such as simulated evolution, or simulated annealing, and comparing the resulting placements using a cost criteria.

Multilayer-metal submicron ASIC technologies, which produce smaller die sizes and faster circuits, come with obvious cost and performance benefits. Submicron ASICs that accommodate more than 500K gates allow a user to put an entire system onto one chip.

On the other hand, the smaller geometries that make such densities possible also make timing-delay prediction and routing within die-size constraints much more difficult. While timing tools in both the logical and physical domains exist for such ASICS, the lack of accurate routability models and the failure to capture or predict unroutable designs have lead to costly design iterations.

Placement and routing are traditionally two separate and independent tasks. Although almost all placement methods attempt to minimize some combination of total wire length and net crossings, the routability of a placement, however, cannot be truly determined until all available routers have had their chances with the chip.

Discovering that a chip is unroutable at such a late design stage is highly costly and undesirable. This phenomenon is particularly noticeable when the netlist is generated using synthesis tools.

SUMMARY OF THE INVENTION

The present invention addresses the problem of modeling and measuring routability at the placement step. Through accurate prediction, problematic or unroutable designs are detected in early stages of the physical design cycle. The routability information can be fed back for placement improvement or incremental synthesis to resolve the routing problems. The results can be fed forward to routers to help guide search directions.

The present invention can also serve as a metric for evaluating different placements of the same design. Providing a fair comparison of different vendor placement results is important. In a framework environment, users can choose the best placement for their designs. Building ASIC tools that improve productivity and minimize risk in submicron design is an important object of the present invention.

More specifically, the present invention provides a method for estimating the wiring interconnect density or congestion in a cell placement for a microelectronic integrated circuit that includes a plurality of cells interconnected by nets of wiring.

The present method provides an estimate of the routing density in the placement by superimposing a pattern of contiguous tiles over the placement, with each of the tiles having edges. Bounding boxes are constructed around the nets respectively, and net probable densities are calculated within each bounding box for the wiring required by each net for each edge respectively.

The net probable densities are summed to produce total probable densities of wiring required by all of the nets for each edge respectively. The net probable density for each edge is calculated as being equal to a wiring capacity of the edge divided by the sum of the wiring capacity of the edge and all other unobscured edges within the bounding box that are collinear with the edge respectively.

A congestion map can be constructed from the total probable densities and the capacities of the edges, and/or these calculations can be used to predict the routability or unroutability of the placement. Provisions are made for edges that are obscured by large megacells or other obstacles, including providing routing detours around the obstacles.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
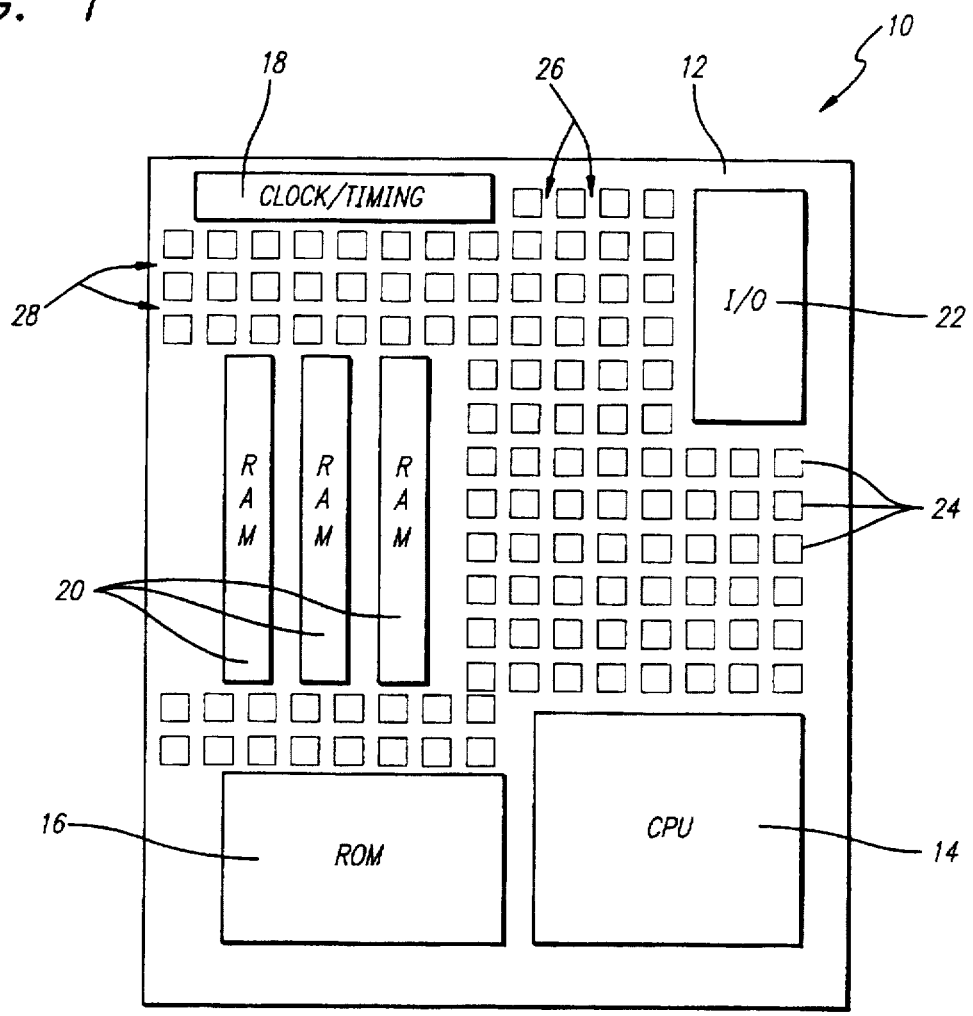
FIG. 1 is a simplified diagram illustrating an integrated circuit chip which can be optimally designed in accordance with the present invention.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (RON) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

Figure 2:
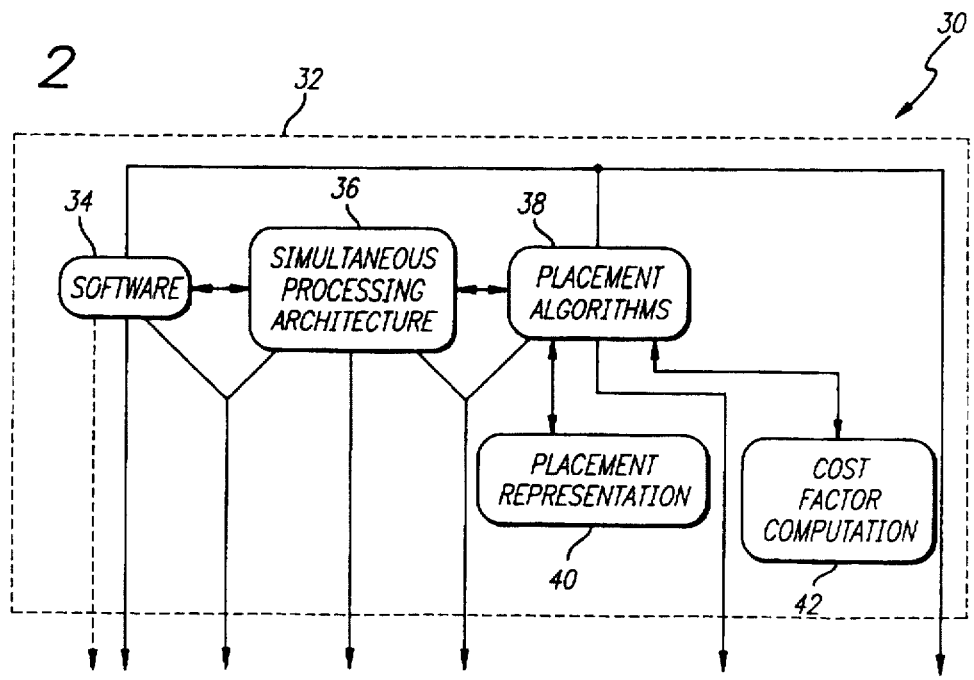
FIG. 2 is a diagram illustrating the main blocks of a multi-processing optimization system for practicing a method of the present invention.

FIG. 2 illustrates an integrated circuit physical design automation system 30 for producing an optimized placement of the cells 24 such as illustrated in FIG. 1 in accordance with a method of the present invention.

The system 30 receives inputs for a user specified integrated circuit design including a netlist, a library of standardized microelectronic elements or cells and functional units including combinations of cells and a set of rules that define the objectives of the design.

The system 30 decomposes these inputs into a plurality of parallel processes or tasks that are executed simultaneously using individual processing units. In general, one or more processors coordinate the operation of other processors, which are optimized, evaluated and recombined to produce an optimal cell placement which may or may not satisfy a predetermined performance objective.

The optimal cell placement produced by the system 30 is used to generate masks for fabrication of the desired integrated circuit chip.

The system 30 comprises a global operating system 32 that generally controls and coordinates the operation of parallel processing software 34 and simultaneous processing architecture 36.

The architecture 36 includes a plurality of parallel processors and a memory structure for simultaneously executing methodologies or algorithms 38 for measuring the relative costs of cell placements and minimizing the costs. Implementation of the algorithms 38 is facilitated by a cell placement representation 40 and cost function or factor computation 42. The architecture 36 can be of any type, such as Distributed Shared Memory (DSM), that enables parallel processing in accordance with the method of the mention.

Like all things in nature, congestion is almost always localized and rarely uniformly distributed. Also, like all laws in nature, the sum of the pieces rarely equals the whole. It is of no surprise, then, to observe that the total wirelength or net intersection across a half plane (a vertical or horizontal line that divides a chip into two parts) of the chip rarely captures the heart of routability. For this reason, the present invention utilizes a two-dimension analysis of the chip to ensure routing predictability.

Figure 3A:
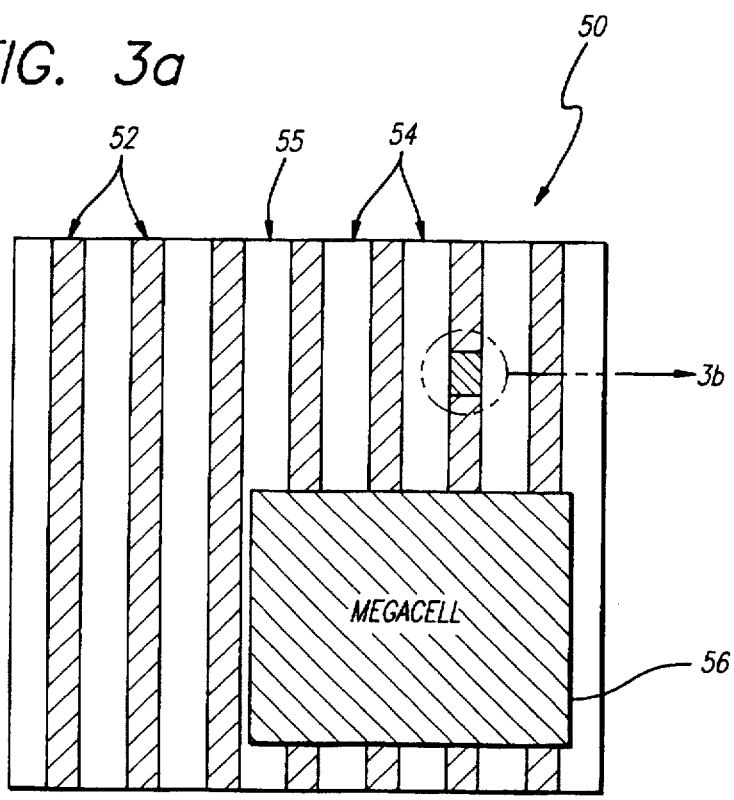
FIG. 3a is a simplified diagram illustrating an integrated circuit chip as comprising vertical columns and routing channels.

A simplified chip 50 consists of alternating columns 52 and channels 54 as shown in FIG. 3a. Standard cells are arranged in a placement 55, and must reside in the columns 52. Cells have equal width but variable heights.

The individual cells of the placement 55 are not visible in the simplified drawing of FIG. 3a, but correspond to the cells 24 of FIG. 1. The placement 55 is produced using the placement algorithms 38 and the simultaneous processing architecture 36 described above.

A First Metal layer (FM) and a Third Metal layer (TM) are used for vertical wires (wiring). The Second Metal layer (SM) is used for horizontal wires. SM wires can run over cells and are used as feedthroughs. Each cell contains layout blockages and routing resources on each metal layer.

Although the present invention will be described and illustrated as being applied to three-layer metal wiring, the invention is not so limited, and the scope of the invention can be extended to higher metal layer technologies.

As illustrated in FIG. 3a, a megacell 56 is a giant block with a predefined layout, and constitutes a generalization of the blocks 14, 16, 18, 20 and 22 of FIG. 1. Typically, the megacell represents a routing obstacle in two or more routing layers.

Figure 3B:
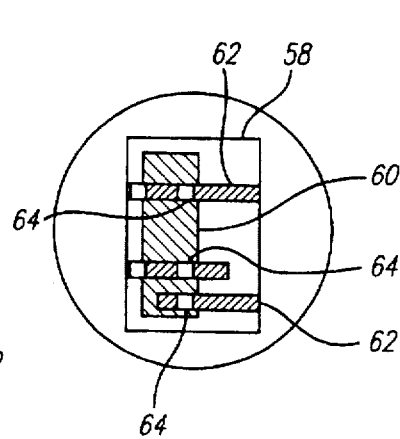
FIG. 3b is an enlarged view of a portion of FIG. 3a, illustrating blockages in metallization or wiring layers.

However, as will be described below, feedthroughs of a megacell can be used by the present method. Further illustrated in FIG. 3b is a standard cell 58 having an FM blockage 60, SM blockages 62 and combined FM and SM blockages 64.

Figure 4:
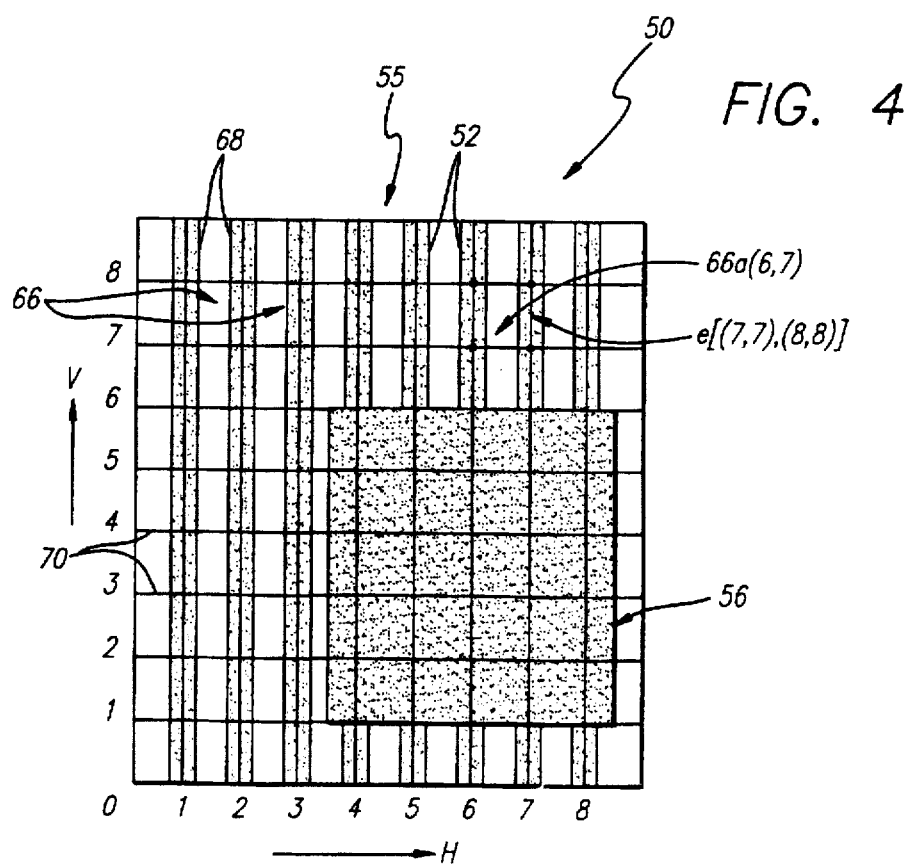
FIG. 4 is a diagram illustrating how a pattern of cut lines, tiles and edges is superimposed over the integrated circuit of FIGS. 3a and 3b.

In order to capture local routing congestion, a detailed two-dimensional analysis is required. As illustrated in FIG. 4, the chip 50 is divided into an orthogonal array or pattern of contiguous tiles 66 by vertical (V) cut lines 68 and horizontal (H) cut lines 70, such that the tiles 66 are superimposed on the placement 55. In order to detect SM feedthrough congestion and detour traffic that frequently occur in the vicinity of megacells, it is important that a subset of the cut lines 68,70 go through columns 52 and along boundaries of the megacell 56.

The notation t(x,y) denotes a tile whose lower-left corner is at the intersection of horizontal and vertical cut lines x,y. In the illustrated example, a tile 66a is designated as t(6,7), since its lower-left corner is at the intersection of the horizontal cut line x=6 and the vertical cut line y=7. A line segment between a pair of tiles 66 is called an edge e. Each edge e is described by its terminal positions (x1,y1), (x2,y2).

For each edge e, two variables are defined: capacity C(e) and density D(e). Routing capacity represents the supply of free routing resource on the edge e, whereas routing density represent the demand for routing resources on the edge e. Capacity and density are measured in unit of grids. Every grid represents a routing track or feedthrough location.

Capacity C(e)

The capacity C(e) of an edge e is defined as the number of free routing grids on the edge e. The capacity of a vertical edge is the number of SM feedthrough grids, whereas that of a horizontal edge is the sum of the FM and TM routing tracks.

Definition 1

Let L(e)=Length of edge e in grids
 T(e)=Total number of grids on e =L(e) if e is vertical (SM) =L(e) x 2 if e is horizontal (FM and TM)
 B(e)=Number of blocked grids on e
 The capacity C(e) of an edge e is
 C(e)=T(e)−B(e)

Figure 5:
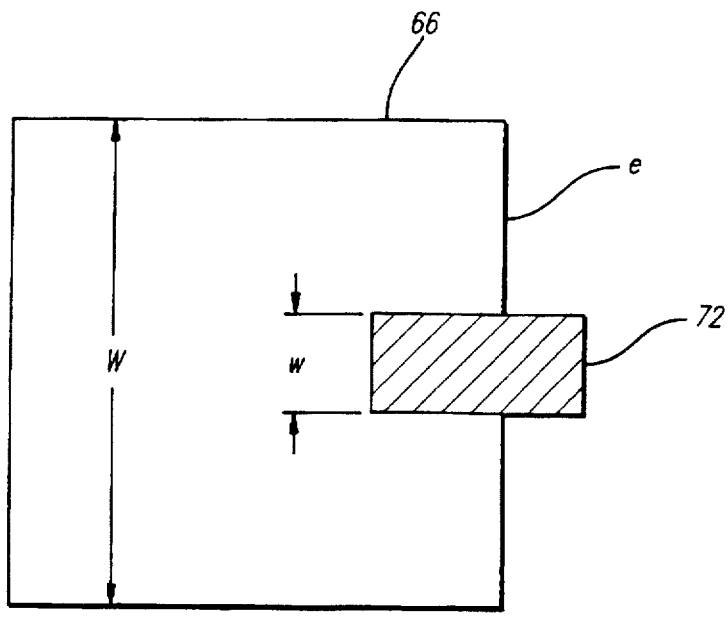
FIG. 5 is a diagram illustrating how blockage reduces edge capacity.

Megacells, internal wires of standards cells, power/ground, clock and any other preexisting wires are considered obstacles or obstructions to routing. Obstacles reduce the capacity of edges that overlap with them. The reduction in capacity is the width of blockage.

Where the grid spacing is uniform, the capacity of an edge e can also be specified using the unblocked length of the edge e. As illustrated in FIG. 5, the total length (width) of an edge e is designated as W, whereas the length of a blockage or obstruction 72 is designated as x. The capacity C(e) can therefore be expressed as C(e)=W−w.

Figure 6:
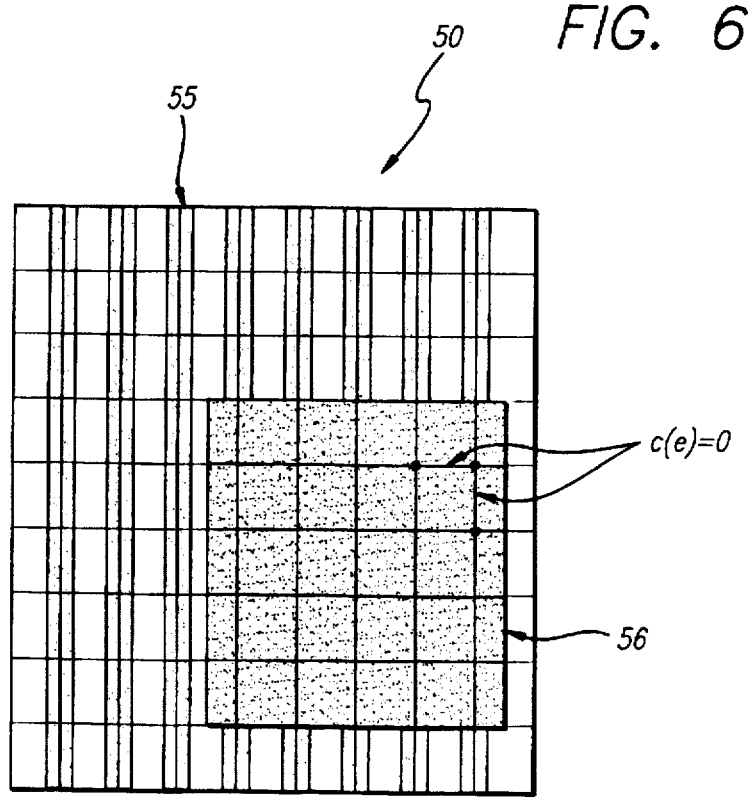
FIG. 6 is a diagram illustrating how edges that are completely blocked by a megacell have zero capacity.

In two-metal-layer technology, as illustrated in FIG. 6, megacells such as 56 typically fully block both wiring layers. Clearly, any edge e covered by such a megacell has a capacity equal to zero.

Figure 7:
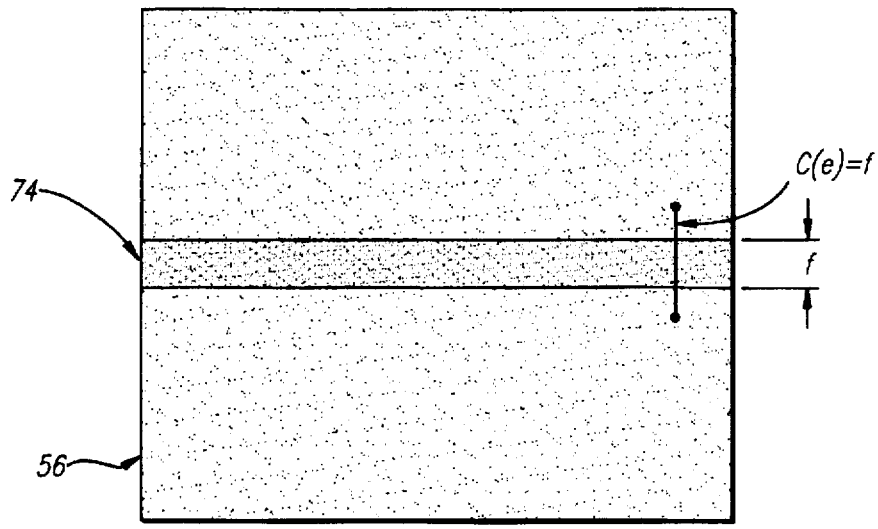
FIG. 7 is a diagram illustrating how megacell feedthroughs can be allocated to edge capacity.

In multiple-metal-layer technology, third and fourth metal layers over megacells are available for feedthrough connections. As illustrated in FIG. 7, the number of feedthroughs over the megacell 56 is equal to the capacity of edges that overlap with the megacell 56. In the illustrated example, the capacity of an edge that is overlapped by a feedthrough 74 having a length f is equal to C(e)=f.

Density D(e)

The subsequent sections address the problem of accurate modeling of routing density. Actual routing is typically CPU-intensive. It is critical to approximate the routers' behaviors, thus providing an accurate estimation of routability, without performing actual routing. The density model must be effective and efficient in capturing routers' characteristics. These includes the impact of porosity (quantified as capacity) on the cost of edges, construction of routing tree and detour effects.

Density Estimation and Routability Prediction

The basic density or congestion estimation and routability prediction method of the present invention comprises the following steps.

(a) Convert all "primary" nets having more than two pins into "secondary" nets that have only two pins each.

(b) Superimpose a pattern of contiguous tiles over the placement, with each of the tiles having edges.

(c) Construct bounding boxes around the secondary nets.

(d) Calculate, within each bounding box in accordance with a predetermined function of wiring capacities C(e) of the edges, a "net" probable density δD(e) of the wiring required by the net for each edge respectively. Each value of net probable density represents the probability of the wiring of the net passing through one edge e in the bounding box.

The net probable density δD(e) for each edge e is preferably calculated as being equal to a wiring capacity of the edge divided by the sum of the wiring capacity of the edge and all other unobscured edges within the bounding box that are collinear with the edge.

(e) Sum the net probable densities to produce "total" probable densities D(e) of wiring required by all of the nets for each edge. Each value of total probable density represents the probability of wiring for the entire placement (constituted by all of the secondary nets) passing through one edge e. One value of D(e) will be calculated for each edge e of the placement.

(f) Predetermining a threshold ratio representing a maximum allowable ratio of edge capacity/density.

(g) Calculating density ratios R(e) for the edges as being equal to the total probable densities D(e) divided by wiring capacities C(e).

(h) Comparing the density ratios R(e) with the threshold ratio.

The data produced in step (h) can be used for performing either or both of the following steps.

(i) Constructing a congestion map indicating edges for which the density ratio R(e) exceeds the threshold ratio.

(j) Predicting that the placement is unroutable if any or more than a predetermined number of the density ratios R(e) exceed the threshold ratio.

All of the steps of the present method can be performed independently on a large number of bounding boxes simultaneously using the parallel processing architecture 36 described above. This enables the present method to be performed at very high speed and in a small amount of time using currently available parallel processing systems.

The theoretical basis for the present method and a detailed description thereof is presented below.

2-pin Nets

Figure 8:
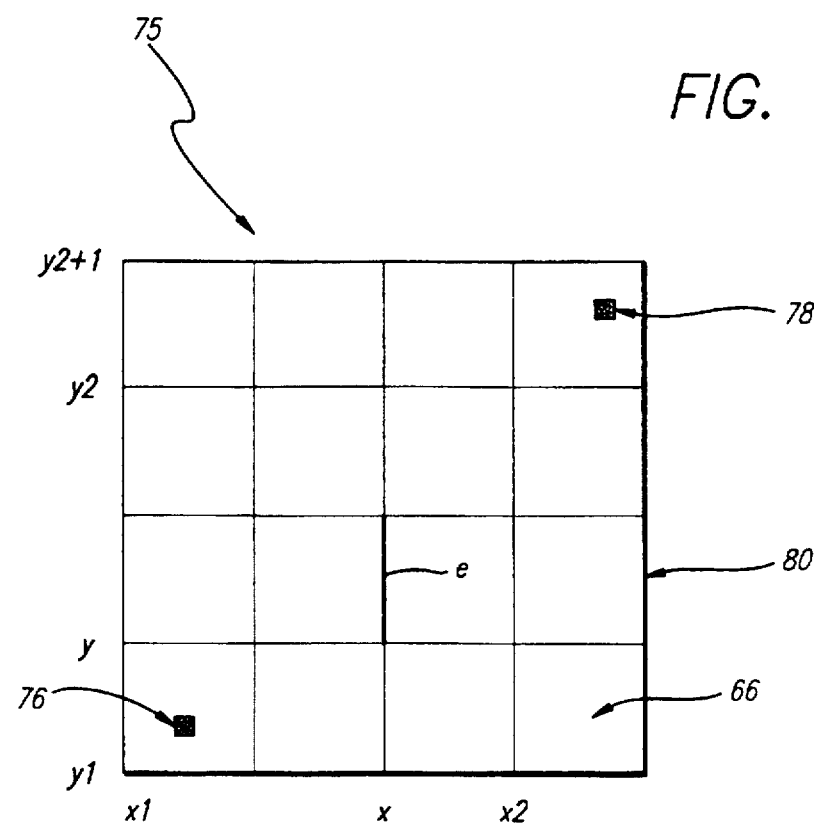
FIG. 8 is a diagram illustrating a two-pin net.

As described above, each primary net including more than two pins is converted into a plurality of secondary nets, each of which consists of only two pins. FIG. 8 illustrates a net 75 that comprises two pins 76 and 78 in tiles t(x1,y1) and t(x2,y2) respectively.

A bounding box 80 for the net is constructed as being as the smallest rectangle enclosing the pins 76 and 78, i.e., all tiles between t(x1,y1) and t(x2,y2). To measure the demand of routing resource per layer, all possible wiring paths of the net within the bounding box 80 are examined.

Assuming that the wiring path of a net consists of Manhattan (rectilinear) wiring segments, the demand or density of a horizontal SM wire to cross over a vertical edge e is modeled as the probability $\delta D(e)$ of a SM horizontal wiring segment to cross over the edge e.

Definition 2

The 2-pin net 75, with pins 76 and 78 in tiles (x1,y1) and (x2,y2), contributes to the routing density of a vertical edge e by $$\delta D(e) = \frac{C(e)}{C(x,y1,y2)}$$

where $$C(x,y1,y2) = \sum_{y=y1}^{y2} C((x,y),(x,y+1))$$

Similarly, its contribution to the routing density of a horizontal edge e is $$\delta D(e) = \frac{C(e)}{C(x1,x2,y)}$$

where $$C(x1,x2,y) = \sum_{x=x1}^{x2} C((x,y),(x+1,y))$$

In other words, the net density $\delta D(e)$ for the edge e is equal to the capacity of the edge e divided by the capacity of the edge e plus the capacities of all edges that are collinear with the edge e within the bounding box 80. Thus, the net probable density $\delta D(e)$ is equal to the capacity of the edge e divided by the total capacity of the four edges extending from x,y1 to x,y2+1.

There are several physical meanings associated with Definition 2.

(1) Given any half plane of the bounding box (produced by a vertical or horizontal line that divides the bounding box 80 into two parts), the routing path must cross the half plane once assuming no detour. Therefore, the probability of crossing any half plane of the bounding box 80 is one. Definition 2 ensures that the sum of the routing density across any vertical or horizontal half plane is always one.

(2) Edges with larger capacity, i.e., porous edges, have higher probability of allowing wires to go through. Edges with lower capacity represent resistance and thus have lower probability. With this feature, the present method approximates many routers' strategy of edge cost setting and first-order routing effect.

(3) A net with a large bounding box contributes less density to a tile edge compared to a net with a small bounding box, since it has many more alternating routing paths.

Local congestion is the result of many nets competing for the same routing resource. Therefore, in order to determine the total competition for an edge e, the total routing or wiring density of edge e is computed by adding individual probability density, $\delta D(e)$, over all nets whose bounding box contains e. The resulting routing density represent the total demand D(e) of routing tracks or feedthroughs over the edge e.

Detour

The basic method described above is preferably expanded to simulate the routers' detour capabilities in the presence of routing obstacles. This is achieved by redistributing the routing density to neighboring tiles of the obstacles. The present invention includes several cases of obstacle topology and methods of detour simulation.

Case 1

Figure 9:
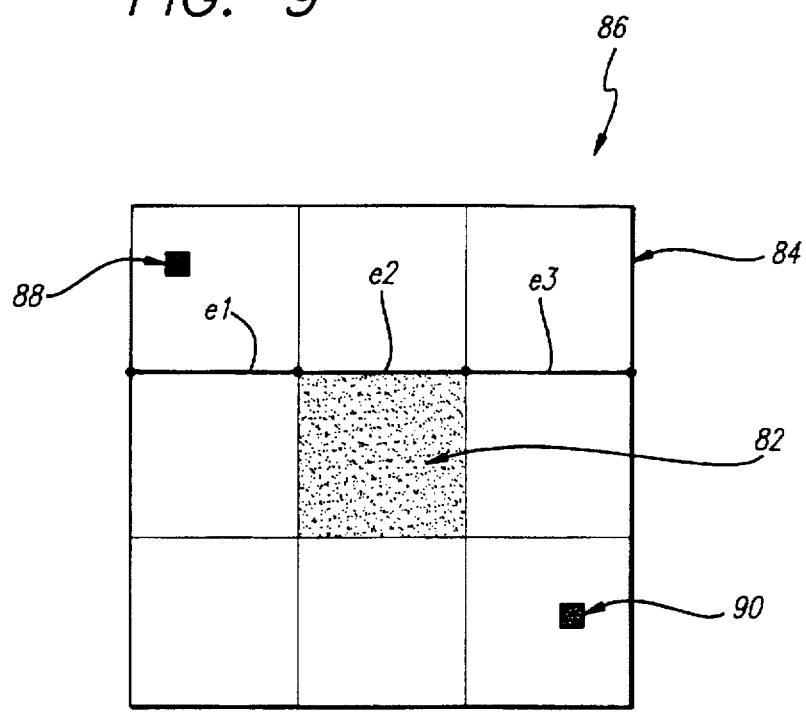
FIG. 9 is a diagram illustrating an obstacle that is completely contained in a bounding box.

In the simplest form, as illustrated in FIG. 9, an obstacle 82 is completely contained in a bounding box 84 for a net 86 consisting of pins 88 and 90. Clearly, vertical interconnection of the net 86 must either go through an edge e1 or an edge e3, since an edge e2 is blocked or obstructed. Hence the routing density of these edges are:

$$\delta D(e1) = \frac{C(e1)}{C(e1) + C(e3)}$$

$$\delta D(e3) = \frac{C(e3)}{C(e1) + c(e3)}$$

Since C(e2)=0, the above equations can be written as:

$$\delta D(e1) = \frac{C(e1)}{C(e1) + C(e2) + C(e3)}$$

$$\delta D(e3) = \frac{C(e3)}{C(e1) + C(e2) + C(e3)}$$

These equations have exactly the same form as Definition 2.

Therefore, the routing density function as defined in Definition 2 has naturally taken care of this type of routing obstacle.

Case 2

Figure 10:
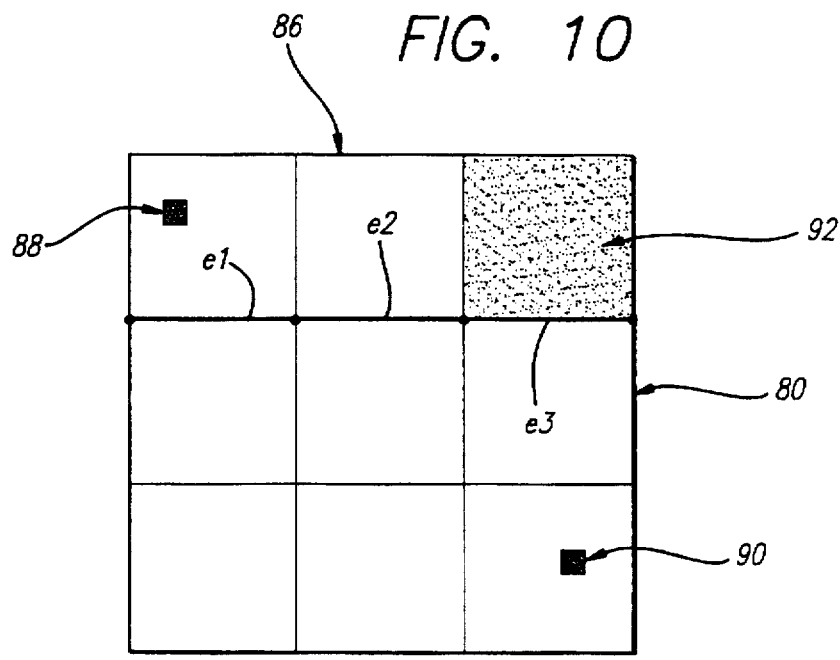
FIG. 10 is a diagram illustrating an obstacle at a corner of a bounding box.

As illustrated in FIG. 10, an obstacle 92 blocks one corner of the bounding box 80. This is an extreme example of Case 1. Hence the same solution is adopted.

Case 3

Figure 11:
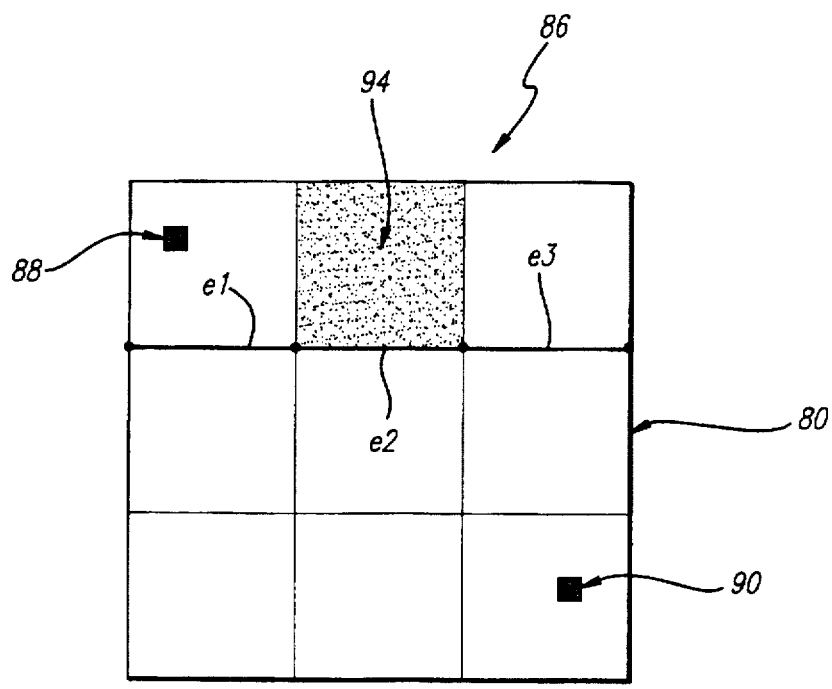
FIG. 11 is a diagram illustrating an obstacle blocking a tile in a bounding box boundary.
Figure 12:
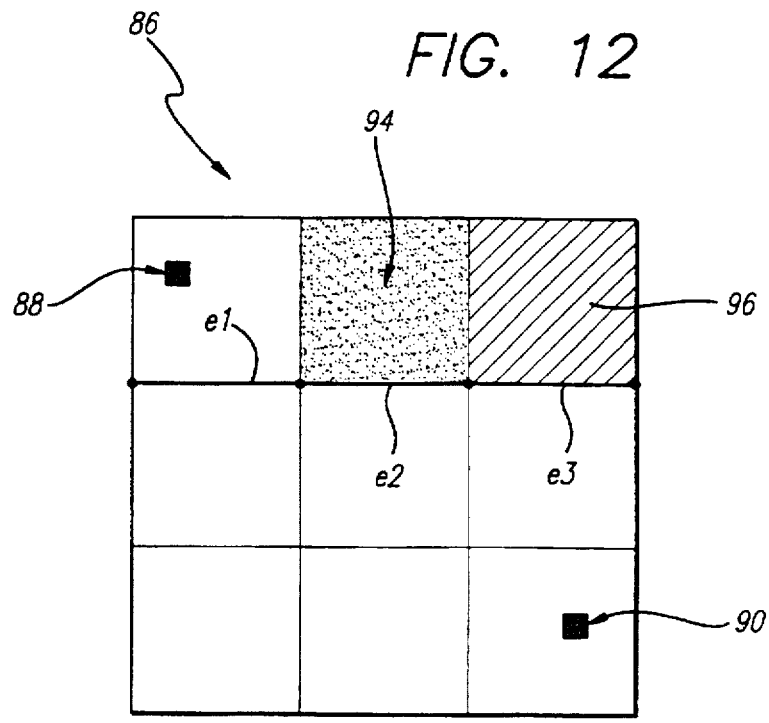
FIG. 12 is a diagram illustrating how an area of a bounding box adjacent to the blocked is designated as also being blocked for the purpose of computing wiring density.

If an obstacle blocks a portion of the boundary of the bounding box 80 as illustrated in FIG. 11, the wiring path of the net 86 is highly unlikely to pass through a hatched tile 96 as illustrated in FIG. 12.

In this case, all edges of the hatched tile 96 are designated as a "temporary obstacle to the net 86", and all edges of the tile 96 are temporarily assigned zero capacity and thus forbidden from routing. Making this shift transforms this type of blockage to Case 2. The routing density computation follows Definition 2.

To generalize Case 3, when a tile that lies on a boundary of a bounding box is obscured and all tiles between the tile and an orthogonal boundary of the bounding box do not enclose pins of the respective net, all edges of these tiles are designated as being obscured or blocked (zero capacity).

Case 4

Figure 13:
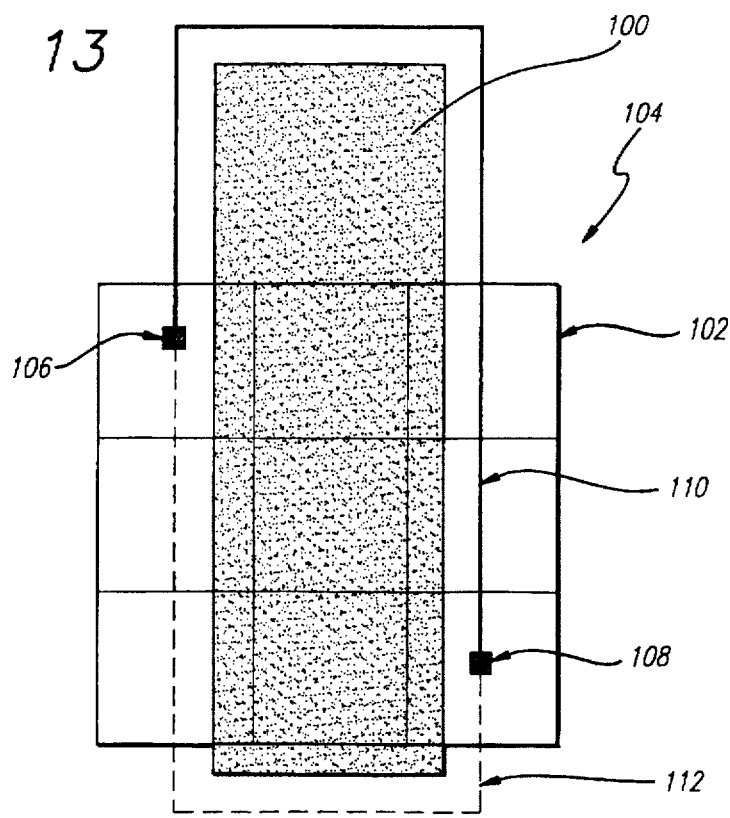
FIG. 13 is a diagram illustrating an obstacle that completely blocks the length of a bounding box.

When an obstacle 100 completely blocks either the length or width of a bounding box 102 as illustrated in FIG. 13, a router must detour around the obstacle 100. The detour path must travel outside the bounding box 102 in order to complete interconnection. Assuming that the bounding box 102 encloses a net 104 consisting of pins 106 and 108, the detour can take one of two paths 110 or 112 around the top and bottom of the obstacle 100 respectively.

Based on this observation, present method further identifies tiles where the detour path is most likely to traverse, and increments their routing density. This is achieved by expanding the bounding box in the least expensive direction, which minimizes a cost factor such as bounding box size or wirelength for the net.

Figure 14:
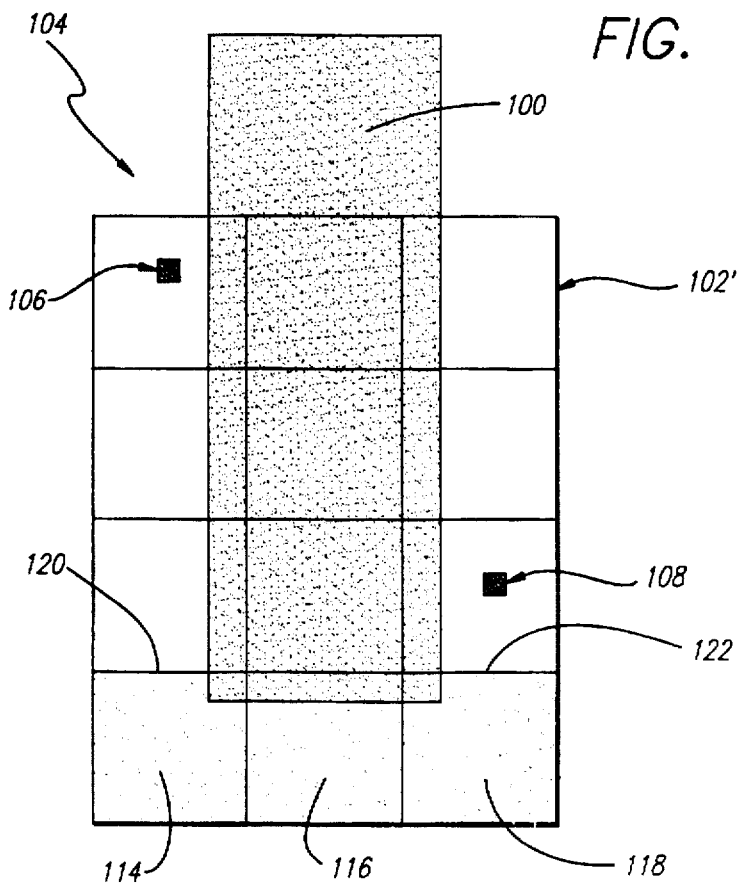
FIG. 14 is a diagram illustrating expanding the bounding box of FIG. 13 in a least expensive direction.

As illustrated in FIG. 14, the bounding box 102 is expanded and redesignated as 102' by adding three additional tiles 114, 116 and 118 to the bottom of the bounding box 102 to allow the detour path 112. This is the least expensive direction (lowest cost factor), since it would require six tiles to be added to the top of the bounding box 102 to provide the detour path 110.

The problem is transformed to that of Case 3 which was solved. The only difference is that a factor of 2 must be introduced in the numerator of Definition 2 for horizontal edges 120 and 122 of the added tiles 114 and 118 since the detour path would require two vertical wires to make the connection.

Case 5

More complicated obstacle topologies are theoretically interesting but rarely encountered in real designs. Experience has determined that a combination of at most the three types of obstacles described above are found within a single bounding box. Heuristic methods similar to finding obscured regions in Case 3 are used to solve this problem.

Multi-pin Nets

Almost all routers need to find a minimum rectilinear Steiner tree or a minimum spanning tree. Each edge of the tree defines a 2-pin subnet, as is required for practicing the present method. However, this does not mean that such a net has only a single rigid routing pattern. In fact, a mere 2-pin subnet can admit many different Manhattan paths. The combination yields even more possibilities for the net.

Following the routers' approach, the present method computes a minimum rectilinear Steiner tree for each 2-pin or 3-pin net and a minimum spanning tree for each N-pin net. The computation of these entities is well known in the art per se, and the details thereof are not part of the present invention.

A treatise on the computation of minimum rectilinear Steiner trees and minimum spanning trees is found, for example, in a textbook entitled "Algorithms for VLSI Physical Design Automation", by Naveed Sherwani, Kluwer Academic Publishers, Boston 1993, pp. 73–85.

Each edge of a tree constitutes a 2-pin subnet whose routing density is computed in the manner described in the previous sections.

Ratio and Threshold

The relative ratio between routing density and capacity indicates the amount of wiring traffic through an edge. When the ratio exceeds a threshold value, congestion is likely.

Definition 3

A density ratio R(e) for each edge is given as $$R(e) = \frac{D(e)}{C(e)}$$

Figure 15:
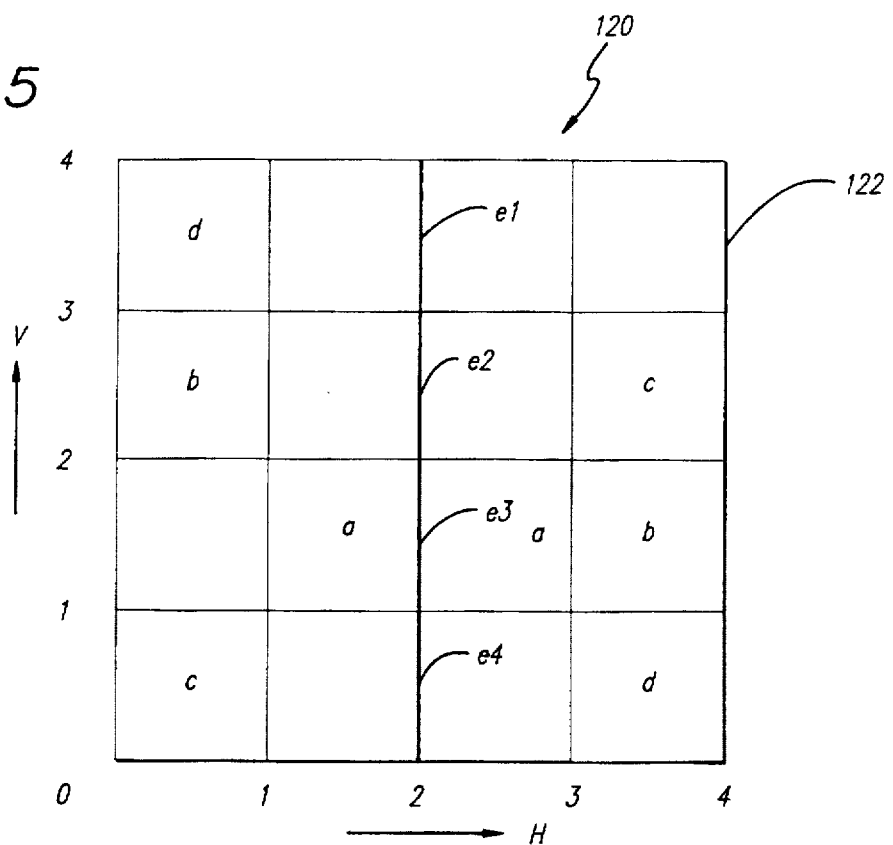
FIG. 15 is a diagram illustrating calculation of a pathological or unacceptable threshold ratio value.

To determine a threshold value for R(e), a pathological case is considered as illustrated in FIG. 15. A generalization of this case leads to a pathological threshold ratio which represents a maximum allowable ratio of R(e).

A simplified placement 120 includes four nets a—a, b—b, c—c and d—d, each consisting of two pins, and four collinear vertical edges e1, e2, e3 and e4. It will be assumed that the capacity of each edge is unity.

The edge having the highest total density D(e) is e3, since all four nets a—a, b—b, c—c and d—d can route feedthrough SM wiring therethrough. The net a—a contributes a net density $\delta D(e3)=1$, because the wiring for the net a—a must pass therethrough. The wiring for the net b—b can pass through either edge e2 or e3, and the net density for the net is therefore ½. The wiring for the net c—c can pass through either edge e2, e3 or e4, and the net density is ⅓. The wiring for the net d—d can pass through either edge e1, e2, e3 or e4, and the net density is ¼.

The pathological threshold ratio is taken as the maximum value of D(e) for the placement 120, in this case D(e3).

Threshold ratio=D(e3)=1+½+⅓+¼=2.08

Experiments indicate that a good empirical threshold ratio is approximately 1.6 to 1.85, depending on the number of megacells in a chip.

The capacity C(e), total density D(e) and density ratio R(e) are calculated for each edge, and the density ratios are compared with the threshold ratio. This enables the routability or unroutability of the placement to be predicted with good accuracy.

A placement can be designated as being unroutable if one or more than a predetermined number of density ratios exceeds the threshold ratio. The amounts by which individual density ratios exceed the threshold ratio can also be incorporated into the calculation in a desired manner depending on a particular application.

Figure 16:
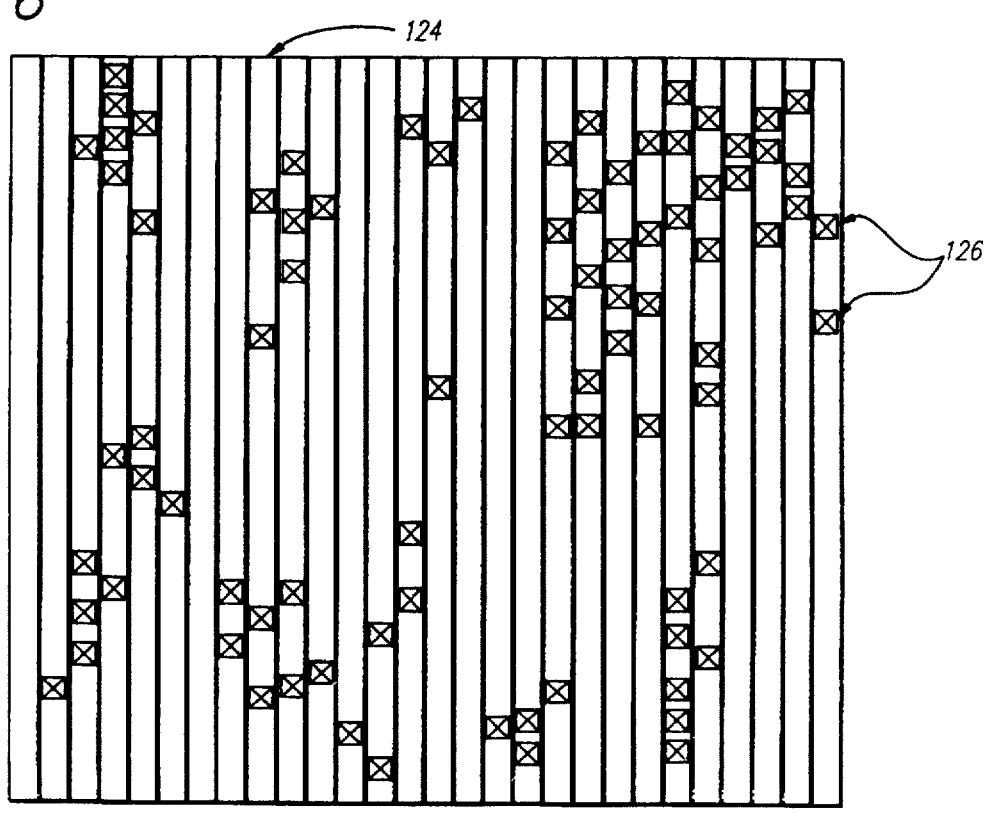
FIG. 16 is a simplified example of a congestion map constructed in accordance with the present invention.

The difference between the density ratios and the threshold ratio can also be used to construct a congestion map of a placement. A congested edge is defined as one whose density ratio exceeds the threshold ratio. The congestion map can indicate only congested edges, or can incorporate a scale of values indicating, for example, the difference between density ratios and the threshold ratio in different colors. A simplified, exemplary congestion map 124 is illustrated in FIG. 16, in which cells including congested edges are designated as 126.

Experimental Results

To test and prove the validity of the present method, a computer program implementing the method was run on several industrial test placements. The program upon completion produced a two dimensional congestion map. All reported congestions are verified. This is very important to ensure that there is no false report. The detailed test was as follow:

1. Place all cells.
2. Run the present program.
3. Run a global router and all possible detailed routers.
4. Compare the congestion map produced by the present program with the global router's map.
5. Compare the present congestion map with the detailed routers' open net area.

Step (5) is necessary because it is possible that the global router may miss some congested regions. Hence it is necessary to compare the present map with the detailed routers' open nets locations.

TABLE 1 below provides the basic statistics of each benchmark. All experiments were done on a Sun SPARC station IPX rated at 28 MIPS.

TABLE 1

| PLACEMENT TYPE | NUMBER OF NETS | NUMBER OF MEGACELLS | AREA PERCENTAGE OF MEGACELLS |
|---|---|---|---|
| DATAPATH | 3600 | 0 | 0% |
| ARRAY-BASED | 7500 | 9 | 18% |
| CELL-BASED | 14000 | 8 | 62% |
| EMBEDDED ARRAY | 14000 | 37 | 20% |

TABLE 2

| CPU TIME (secs) | RATIO OF INVENTION'S CPU TIME TO GR'S CPU TIME | INVENTION'S COVERAGE OF GR'S CONGESTION |
|---|---|---|
| 4 | 0.4% | 95% |
| 10 | 0.2% | 100% |
| 47 | 0.2% | 85% |
| 28 | 0.1% | 100% |

The number of cut lines determines the resolution of the resulting map. The more the cuts, the higher the resolution, the slower the run time.

TABLE 2 above summarizes the results of the experiments. Within tens of seconds, the present program was able to capture 85%–100% of the Global Router's (GR) congestion map. In addition, the present congestion map covered many open net areas produced by the detailed routers.

Cogestion maps were produced by the global router and by the present program for datapath and embedded array designs. The maps were quite similar, demonstrating the accuracy and validity of the present method.

SUMMARY

In order to reduce costly design iteration, it is critical to have models that accurately predict routability early on. The present model has three major parameters: a capacity function that captures all porosity and blockage information, a density function that approximate routers' behavior, and a ratio that reflects the degree of routing congestion.

The bounding box expansion technique is an effective way of estimating detour direction. It is crucial to the success of the present method in the presence of obstacles. Using a tiny fraction of global routersI CPU time, an accurate congestion map can be generated.

The results can be fed back for placement improvement or incremental synthesis, or can be fed forward to guide routing directions. It also allows users to compare different placement of the same design in a framework environment.

Various modifications will become possible for those skilled in the art after receiving the teachings of the present disclosure without departing from the scope thereof.

I claim:

1. A method for producing a cell placement for a microelectronic integrated circuit, said placement including a plurality of cells interconnected by nets of wiring, comprising estimating routing density in said placement by performing the steps of:

(a) superimposing a first set of spaced apart lines over said placement, wherein each of said lines is formed of a plurality of segments;

(b) constructing bounding boxes around said nets;

(c) calculating wiring densities required by each net for each segment respectively in accordance with a predetermined function; and (d) summing said wiring densities to produce total wiring densities required by all of said nets for each segment respectively.

2. A method as in claim 1 wherein step (c) comprises calculating said wiring density for each segment as being equal to a wiring capacity of said each segment divided by the sum of said wiring capacity of said each segment and all other unobscured segments within said bounding box collinear with said each respective segment.

3. A method as in claim 2, wherein:

said nets include pins interconnected by said wiring and said segments are of equal lengths.

4. A method as in claim 2, wherein:

said first set of spaced apart lines extend parallel to a first axes; and step (c) comprises extending a first end of said bounding box in a direction orthogonal to said first axes such that said wiring can be rerouted around said extended first end when a bounding box is obscured.

5. A method as in claim 4, wherein extending the end of said bounding box minimizes a predetermined cost function.

6. A method as in claim 2, wherein step (c) comprises calculating said wiring capacity for each segment as being equal to a total wiring capacity of said each segment minus a wiring blockage of the segment.

7. A method as in claim 1, further comprising the steps of:

(e) determining a threshold ratio;

(f) calculating wiring capacities for each segment; and (g) calculating density ratios for each segment as a predetermined function of said total densities and said wiring capacities.

8. A method as in claim 7, wherein step (g) comprises calculating density ratios for each segment as being equal to said total densities divided by said wiring capacities respectively.

9. A method as in claim 7, further comprising the step of:

(h) performing a comparison of said density ratios with said threshold ratio.

10. A method as in claim 9, further comprising the step of:

(i) constructing a map of said placement indicating segments for which said density ratios exceed said threshold ratio.

11. A method as in claim 1, wherein:

said placement initially comprises primary nets including pins interconnected by said wiring;

the method further comprises the step, performed between steps (b) and (c), of:

(e) converting said primary nets into secondary nets that each include only two pins; and step (c) comprises calculating said wiring density in accordance with a respective secondary net for each segment.

12. A method as in claim 11, wherein step (e) comprises the substeps of:

(f) computing a minimum rectilinear Steiner tree for each 2-pin primary net and each 3-pin primary net;

(g) computing a minimum spanning tree for each primary net having more than three pins; and (h) computing said secondary nets as comprising edges of said minimum rectilinear Steiner trees and said minimum spanning trees respectively.

13. A method for predicting a routing suitability of a cell placement for a microelectronic integrated circuit, said placement including a plurality of cells interconnected by nets of wiring, comprising the steps of:

(a) superimposing a plurality of line segments over said placement;

(b) constructing bounding boxes around said nets respectively;

(c) calculating wiring capacities for said line segments;

(d) calculating wiring densities for each net for each line segment within each bounding box in accordance with a predetermined function;

(e) summing said wiring densities to produce a total wiring density of all nets for each line segment respectively;

(f) calculating density ratios for said line segments based on said total wiring densities and said wiring capacities;

(g) comparing said density ratios with a predetermined threshold ratio; and (h) predicting that said placement is unroutable if more than a predetermined number of said density ratios exceed said threshold ratio.

14. A method as in claim 13, in which said predetermined number is one.

15. A method as in claim 13, wherein step (f) comprises calculating density ratios for each line segment as being equal to said total densities divided by said wiring capacities respectively.

16. A method as in claim 13, in which step (c) comprises calculating said wiring density for each line segment as being equal to a wiring capacity of each line segment divided by the sum of said wiring capacity of said each line segment and all other unobscured line segments within said bounding box that are collinear with said each line segment respectively.

17. A method as in claim 16, wherein:

said nets include pins that are interconnected by said wiring and said line segments are of equal lengths.

18. A method as in claim 16, wherein:

said line segments extend parallel to a first axes; and step (c) comprises extending a first end of said bounding box in a direction orthogonal to said first axes such that said wiring can bypass said extended first end when a bounding box is obscured.

19. A method as in claim 18, wherein extending said bounding box minimizes a predetermined cost function.

20. A method as in claim 16, wherein step (c) comprises calculating said wiring capacity for each line segment as being equal to a total wiring capacity of each line segment minus a wiring blockage of each line segment.

21. A method as in claim 20, further comprising the step of:

(i) constructing a map of said placement indicating line segments for which said density ratios exceed said threshold ratio.

22. A method as in claim 13, wherein:

said placement initially comprises primary nets having pins interconnected by said wiring;

the method further comprises the step, performed between steps (b) and (c), of:

(i) converting said primary nets into secondary nets that each include only two pins; and step (c) comprises calculating said wiring density as required by a respective secondary net for each line segment.

23. A method as in claim 22, wherein step (i) comprises the substeps of:

(j) computing a minimum rectilinear Steiner tree for each 2-pin primary net and each 3-pin primary net;

(k) computing a minimum spanning tree for each primary net having more than three pins; and (l) computing said secondary nets as comprising edges of said minimum rectilinear Steiner trees and said minimum spanning trees respectively.

24. A method for predicting routing suitability for a cell placement for a microelectronic integrated circuit, said placement including a plurality of cells interconnected by nets of wiring, comprising the steps of:

(a) calculating wiring capacities;

(b) calculating individual net wiring densities;

(c) summing said individual net wiring densities to produce a total wiring density;

(d) calculating density ratios based on said total wiring densities and said wiring capacities;

(e) comparing said density ratios with a predetermined threshold ratio; and (f) predicting that said placement is unroutable if more than a predetermined number of said density ratios exceed said threshold ratio.

* * * * *